（12） United States Patent
Song

(10) Patent No.: US 7,142,607 B2
(45) Date of Patent: Nov. 28, 2006

(54) EFFICIENT SUBBAND CHANNELIZER AND SUBBAND COMBINER WITH OVERSAMPLED SUBBANDS

(75) Inventor: William S. Song, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 811 days.

(21) Appl. No.: 10/156,066

(22) Filed: May 28, 2002

(65) Prior Publication Data

US 2003/0223503 A1 Dec. 4, 2003

(51) Int. Cl.
*H04L 27/28* (2006.01)
(52) U.S. Cl. ............ 375/260; 375/349; 375/350; 370/537; 370/542
(58) Field of Classification Search ............ 375/260, 375/340, 349, 350; 370/210, 319, 343, 344, 370/437, 480, 481, 536, 542
See application file for complete search history.

(56) References Cited

U.S. PATENT DOCUMENTS

| | | | | |
|---|---|---|---|---|
| 5,293,382 A | * | 3/1994 | Carson et al. | ............ 370/210 |
| 5,299,192 A | * | 3/1994 | Guo et al. | ............ 370/210 |
| 5,867,479 A | * | 2/1999 | Butash | ............ 370/210 |
| 6,085,077 A | | 7/2000 | Fields et al. | |
| 6,334,219 B1 | | 12/2001 | Hill et al. | |

FOREIGN PATENT DOCUMENTS

| | | |
|---|---|---|
| EP | 1 031 932 A2 | 8/2000 |
| EP | 1 031 933 A2 | 8/2000 |
| EP | 1 032 149 A2 | 8/2000 |
| EP | 1 032 156 A2 | 8/2000 |
| FR | 2 799 073 | 9/1999 |
| WO | WO 99/65172 | 12/1999 |

OTHER PUBLICATIONS

"A Hardware-Efficient, Multirate, Digital Channelized Receiver Architecture," Zahirniak et al. *IEEE Transactions on Aerospace and Electronic Systems*. Jan. 1998, vol. 34, No. 1.
"Digital Channelized IFM Receiver," Fields et al. *IEEE MTT-S Digest*. 1994.

* cited by examiner

*Primary Examiner*—Dac V. Ha
(74) *Attorney, Agent, or Firm*—Gauthier & Connors LLP

(57) ABSTRACT

A subband channelizer that includes a demultiplexer that receives input samples of a signal and distributes the input samples to a plurality of channelizer filter banks. A Fourier transform module that receives outputs from the plurality of channelizer filter banks and performs Fourier transformation on each of the outputs of the channelizer filters, and outputs a plurality of Fourier signals. A plurality of multiplier modules that receive the Fourier signals, and each of the Fourier signals is multiplied with an exponential value assigned to each of the plurality of multiplier modules to produce oversampled subbands. A combiner for generating a wideband signal from a plurality of input subbands is also included.

12 Claims, 4 Drawing Sheets

EFFICIENT SUBBAND CHANNELIZER AND SUBBAND COMBINER WITH OVERSAMPLED SUBBANDS

This invention was made with government support under Contract No. F19628-95-C-0002, awarded by the Air Force. The government has certain rights in the invention.

BACKGROUND OF THE INVENTION

The invention relates to the field of digital communication, and in particular a subband channelizer that generates oversampled subbands with relatively low oversampling ratios.

FIG. 1 is a schematic diagram that demonstrates a prior art hardware implementation of a channelizer 10 for computing short Fourier transform (STFT). As shown, each row represents a polyphase filter $0, 1 \ldots, K-1$. There are 3-K filters altogether. Each of these filters $0, 1 \ldots, K-1$ are assigned N taps with N coefficients. The data inputted to an individual polyphase filter is shifted M samples at a time through a bank of K filters in a snake-like fashion. The outputs of each tap are connected to the input of the tap, which M taps away in a snake-like fashion.

In each of these polyphase filters $0, 1 \ldots, K-1$, the data introduced is multiplied with various coefficients and summed to produce the output. The transposed or retimed version of the polyphase filter will work equally well, as long as it is mathematically equivalent. The filter outputs are then Fourier transformed by way of the Fast Fourier Transform (FFT) processor 12 and multiplied with exponentials $W_k^0 - W_k^{(K-1)mM}$ to produce the oversampled subbands. Each of the exponentials $W_k^0 - W_k^{(K-1)mM}$ is defined as $W_k = e^{(j2\pi k/K) + \phi}$, where $k = 0, 1 \ldots K-1$ and $\phi$ is a phase offset (set to 0 or $\pi/K$ in most cases). The subband oversampling ratio is equal to K/M.

One of the disadvantages with this configuration is that large amount of input data needs to be shifted through the filters. KN data samples needs to be shifted M samples across many polyphase filters each data shift cycle. The KN data samples are shifted M samples across many polyphase filter each data cycle. Such high throughput data shifting network is often difficult to build especially when there are many polyphase filters.

FIG. 2 is a schematic diagram that illustrates a conventional implementation of a combiner 20 for computing inverse short time Fourier transform (ISTFT). The K inputs subbands are multiplied with exponentials $W_k^0 - W_k^{(K-1)mM}$ and inverse Fourier transformed by way of a K-point inverse-fast Fourier transform processor 22. The output of the inverse Fourier transform is routed to a polyphase filter bank $0, 1 \ldots, K-1$. Each row represents a polyphase filter and there are K filters all together. Each polyphase filter has P taps with P coefficients. The input data to each filter $0, 1 \ldots, K-1$ is multiplied with coefficients in each tap and the product is summed through the bank of K filters in a snake-like fashion, shifting M taps at a time as shown. This means the sum of the output from each tap is connected to the sum of the input of tap which is M taps away in the "snake" like path. The transposed or retimed version of the polyphase filter would work equally well, as long as it is mathematically equivalent.

SUMMARY OF THE INVENTION

Accordingly, the invention provides a channelizer and a combiner, which efficiently generates oversampled subbands with relatively low oversampling ratios and a wideband signal from a plurality of input subbands. The invention is more efficient than the channelizer used in the prior art because routing distances are lowered by a substantial factor. Also, the invention does not require additional hardware, such as register for oversampling ratios.

According to one embodiment of the invention, a subband channelizer is provided. The subband channelizer includes a demultiplexer that receives input samples of a signal and distributes the input samples to a plurality of channelizer filter banks, wherein each of the input samples is assigned to one of the plurality of channelizer filter banks. A Fourier transform module that receives outputs from the plurality of channelizer filter banks and performs Fourier transformation on each of the outputs of the channelizer filters, such that the Fourier transformation module outputs a plurality of Fourier signals. A plurality of multiplier modules that receive the Fourier signals, such that each of the Fourier signals is assigned to one of the plurality of multiplier modules so that each of the Fourier signals is multiplied with an exponential value assigned to each of the plurality of multiplier modules to produce oversampled subbands.

According to another embodiment of the invention, a method of generating oversampled subbands is provided. The method includes providing a signal that include input samples, and providing a demultiplexer that receives the input samples of the signal. The input samples are distributed to a plurality of channelizer filter banks, wherein each of the input samples is assigned to one of the plurality of channelizer filter banks, and receiving outputs from the plurality of channelizer filter banks. Fourier transformation is performed on each of the outputs of the channelizer filters, and outputting a plurality of Fourier signals. The method also comprises multiplying each of the Fourier signals with assigned exponential values to produce oversampled subbands.

According to another embodiment of the present invention, a system for generating a wideband signal from a plurality of input subbands is provided. The system includes a plurality of multiplier modules that are each assigned one of the input subbands, such that each multiplier modules multiplies an assigned exponential value to each of its associated input subbands. An inverse-fast Fourier transform module that receives outputs from the multiplier modules and performs inverse Fourier transformation to the outputs from multiplier modules, such that the inverse-fast Fourier transform module outputs a plurality of inverse Fourier signals. A plurality of polyphase filter banks that are each assigned at least one of the inverse Fourier signals by the inverse-fast Fourier transform module, such each of the polyphase filter banks performs the necessary operations to produce samples of the wideband signal.

According to another embodiment of the invention, a method of generating a wideband signal from a plurality of input subbands is provided. The method includes providing a plurality of multiplier modules, and assigning each assigned of the input subbands to one of the multiplier modules. Each of the multiplier modules multiplies an assigned exponential value to each of its associated input subbands. The outputs of the multiplier modules are received, and inverse Fourier transformation is performed on the outputs of the multiplier modules, such that a plurality of inverse Fourier signals are produced. A plurality of polyphase filter banks are provided, and assigning each of the polyphase filter banks at least one of the inverse Fourier signals. Each of the polyphase filter banks performs the necessary operations to produce samples of the wideband signal.

DETAILED DESCRIPTION OF THE INVENTION

The invention provides a subband channelizer that can efficiently channelize with oversampling ratios that are substantially smaller then those in the prior art. The invention requires a constraint that values K and M be divisible by a value L. Thus, the oversampling ratio is K/M, which is equal to (K/L)/(M/L). The values K, M, and L should be chosen such that K/M achieves the desired overhead ratio while L is maximized.

Figure 3:
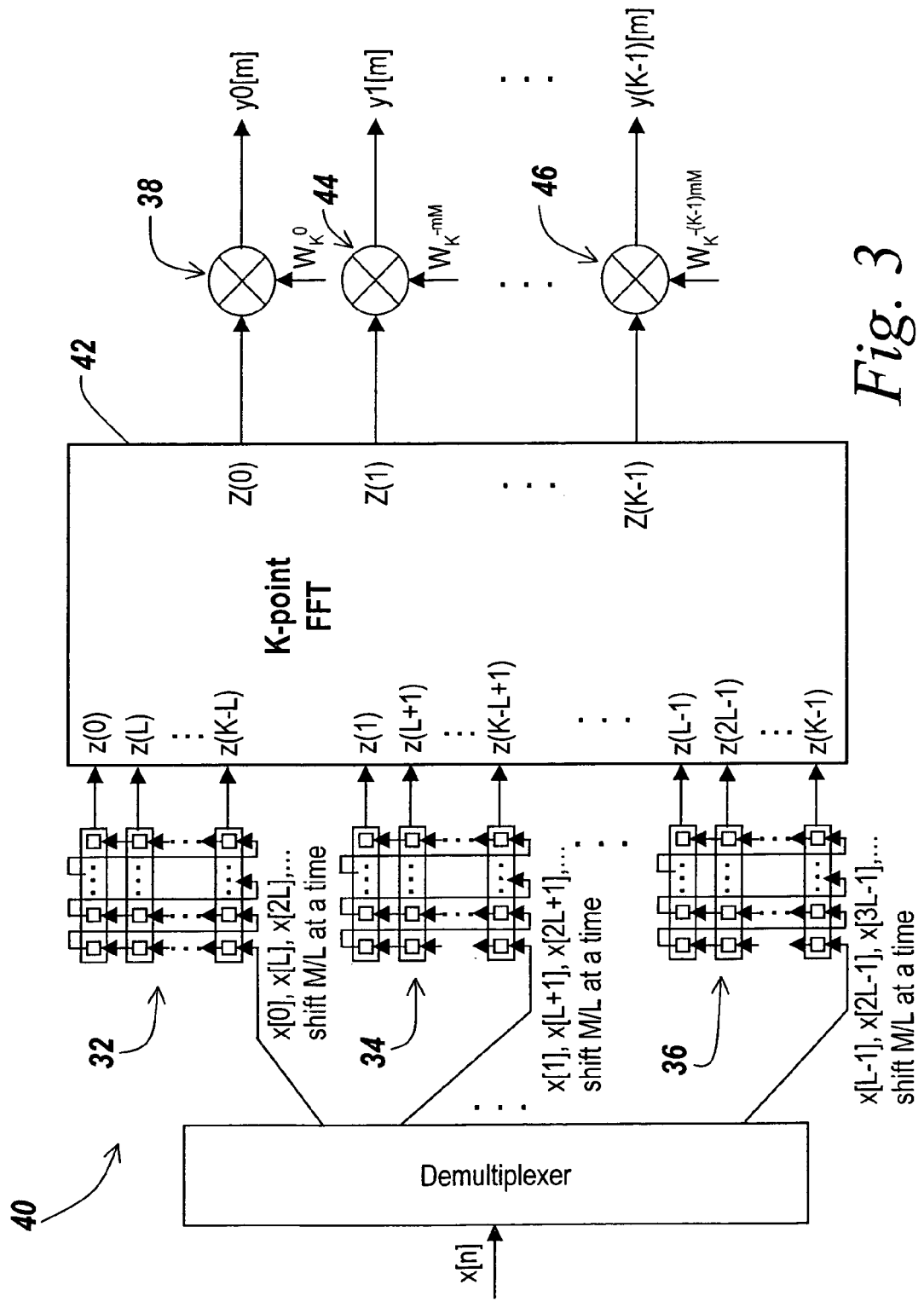
FIG. 3 is schematic diagram of a subband channelizer with oversampled subbands.

FIG. 3 is schematic diagram of a subband channelizer 40 with oversampled subbands. The channelizer 40 includes a demultiplexer 30, L smaller channelizer filter banks 32, 34, and 36 with K/M oversampling ratios, a K-point Fast Fourier Transform processor 42, and exponential multiplication modules 38, 44, and 46. The demultiplexer 30 receives an input signal x[n] and demultiplexes M input samples to L smaller channelizer filter banks 32, 34 and 36 in a round robin fashion.

Figure 1:
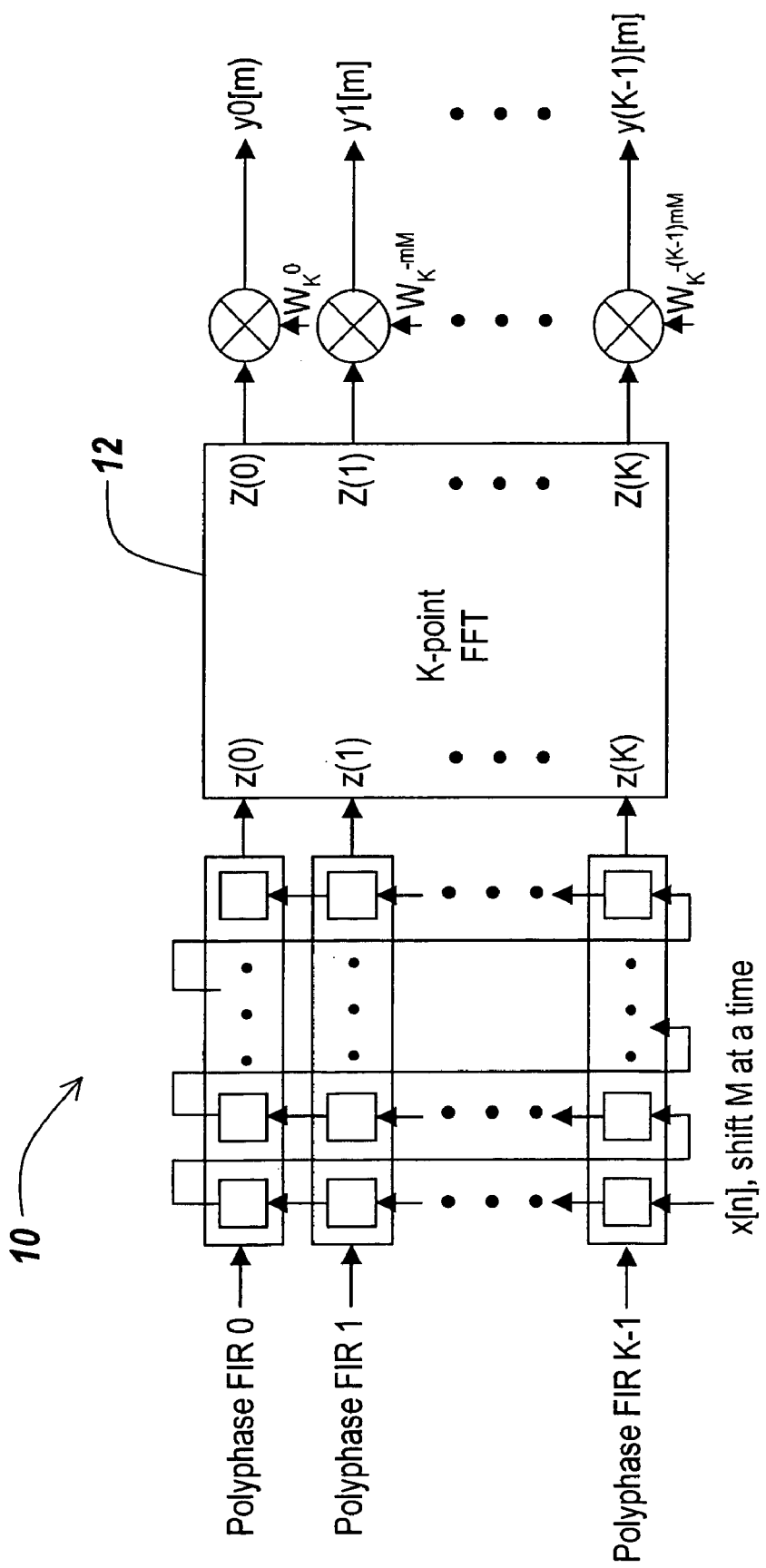
FIG. 1 is a schematic diagram of a conventional hardware implementation for computing short Fourier transform (STFT)

Each of the smaller filter banks 32, 34 and 36 has K/M filters and receives M/L samples at a time. The smaller channelizer filter banks 32, 34, and 36 can be implemented as discussed above in FIG. 1 or by a mathematically equivalent computation engine. The outputs of the filter banks 32, 34 and 36 are then sent to the Fast Fourier transform processor 42. The Fourier transform processor 42 computes the Fast Fourier transform for its inputs z(0)–z(K–1), and its outputs Z(0)–Z(K–1) are sent to the exponential multiplication modules 38, 44, and 46.

The multiplication modules 38, 44, and 46 multiply the outputs Z(0)–Z(K–1) of the Fast Fourier transform processor 42 by exponential values $W_k^0$–$W_k^{(K-1)mM}$, respectively. Each of the exponential values $W_k^0$–$W_k^{(K-1)mM}$ is defined as $$W_k = e^{(j2\pi k/K) + \phi}, \quad \text{Eq. 1}$$

where k=0, 1 ... K–1 and $\phi$ is a phase offset which is set to 0 or $\pi/K$, to result in oversampled subbands.

The channelizer 40 is much more efficient than the channelizer 10 of the prior art because input data is routed through much more shorter distances except at the input. The routing distance are approximately L times less in channelizer 40. Channelizer 40 can also achieve any desired oversampling ratio, and especially an oversampling ratio that is at least a factor of 2.

Figure 4:
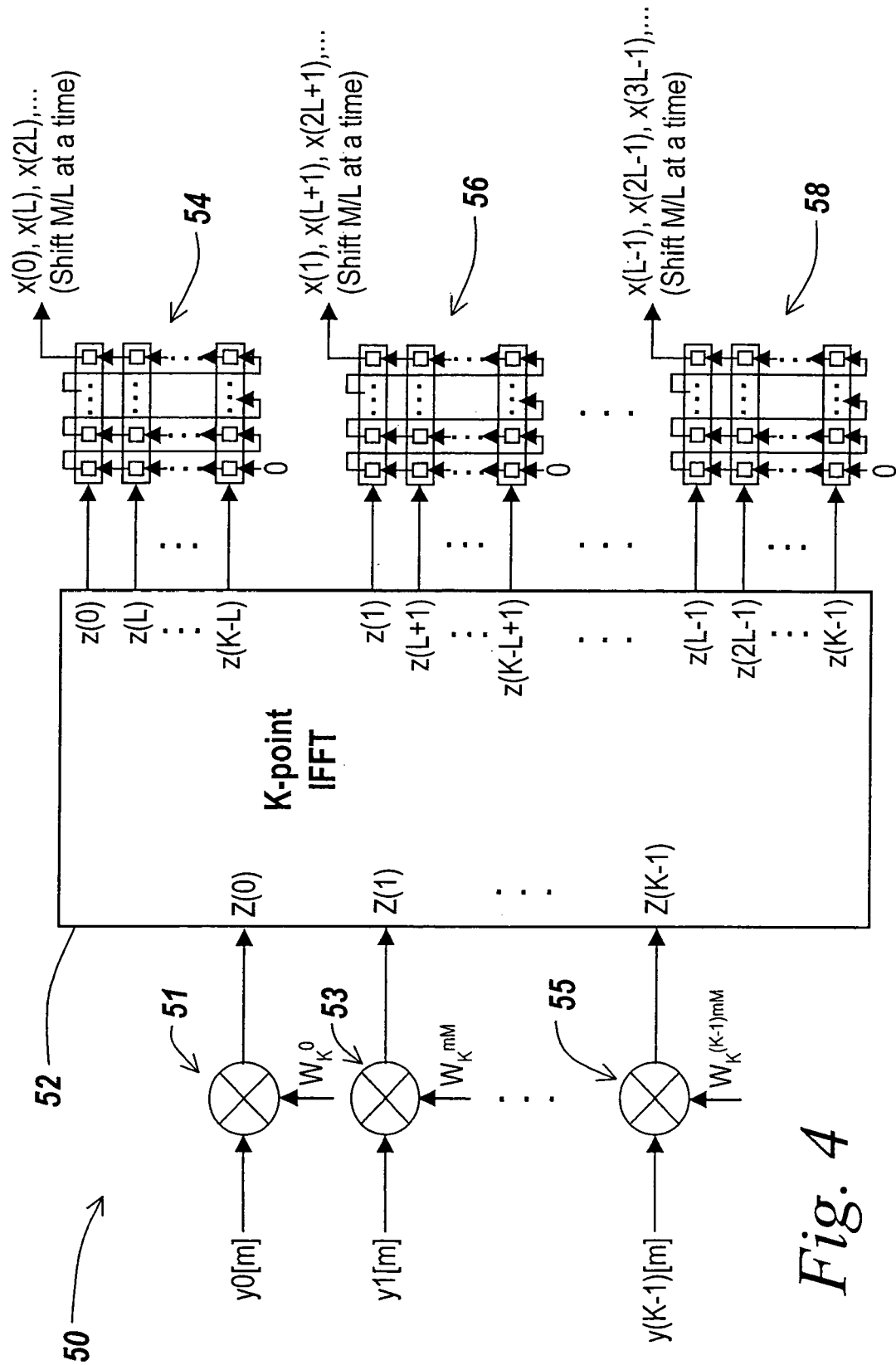
FIG. 4 is a schematic diagram of a subband combiner in accordance with the invention.

FIG. 4 is a schematic diagram of a subband combiner 50 in accordance with the invention. The subband combiner 50 includes a subband inputs y0[m] ... y(k–1)[m], exponential multiplication modules 51, 53, and 55, inverse fast Fourier Transform (IFFT) processor 52, and L polyphase filter banks 54, 56, and 58. The subband inputs y0[m]–y(K–1)[m] are inputs to exponential multiplication modules 51, 53, and 55, respectively. The exponential multiplication modules 51, 53, and 55 multiply their respective inputs with exponential values of $W_K^0$–$W_K^{(K-1)mM}$.

The outputs of the exponential multiplication modules 51, 53, 55 are provided as inputs to the K-point Inverse IFFT processor 52. IFFT processor 52 performs the inverse fast Fourier Transforms of its inputs Z(0)–Z(K–1), and outputs its inverse fast Fourier transform values z(0)–z(K–1) to polyphase filter banks 54, 56, and 58, respectively. The exponential values are equivalent to these defined in Eq. 1.

Figure 2:
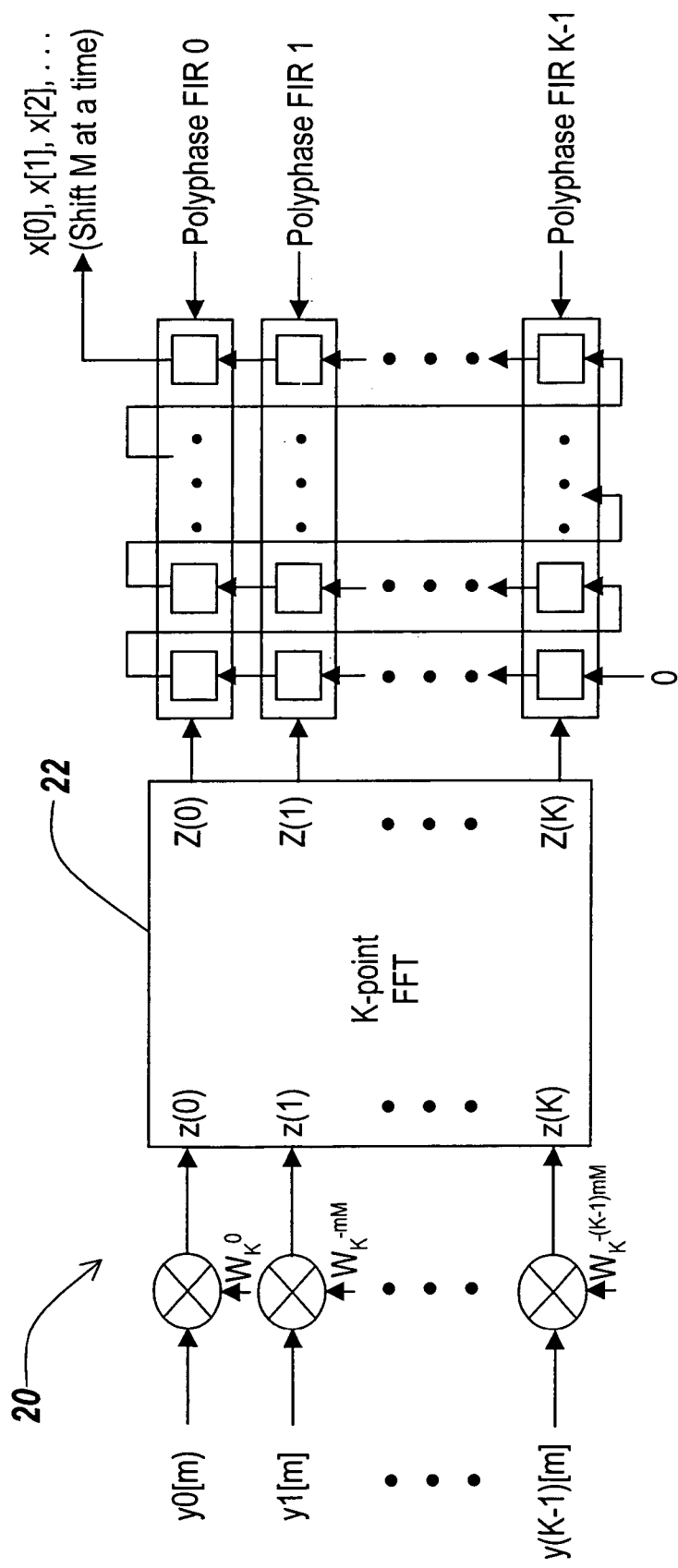
FIG. 2 is a schematic of a conventional implementation of the inverse short time Fourier transform (ISTFT)

The polyphase filter banks 54, 56, and 58 have a K/M oversampling ratio, and could be implemented as shown in FIG. 2 or by a mathematically equivalent computation engine. Each of the filter banks 54, 56, and 58 has K/M filters and receives M/L samples of data at a time. Outputs of the filter banks 54, 56, and 58 are the wideband output signals. If a single stream high-speed data output is desired, a high-speed multiplexer can be added to the outputs of the filter banks 54, 56, and 58.

The subband combiner 50 is much more efficient then the conventional combiner 20 mentioned above in FIG. 2, because the input data is routed through much shorter distances except at the input. The routing distances are approximately L times less in the new channelizer. The subband combiner 50 is also compatible with oversampling rations lower than the factor 2.

There are many applications for which subband channelizer and subband combiner may be used in. Wideband radar and sonar signals can be channelized into narrow subbands before signal processing in order to minimize signal dispersion. Many communications and intelligence applications also require channelizing wideband signals. Consumer applications such wireless communication and set top boxes may also need to channelize wideband data. Essentially, the invention can be useful for any application where wide bandwidth is broken into subbands.

The invention can be used in a VLSI signal processor chip-set. The chip-set can consist of a polyphase filter chip and a Fast Fourier transform chip. The chip-set implements channelization with M=96, K-128, and a 4/3 oversampling ratio. Further, the chip-set may be fabricated on a 0.25 micron and smaller CMOS processes, which would allow the chip-set to provide up to 10–1000 times higher computational throughput and power efficiency as compared to off-the-shelf computation products, such as multi-processor board level computers and FPGA processor boards.

The invention can also be implemented in software. The software implementation can provide more performance advantages for multi-processor platforms, because the computation can be broken up more neatly to multiple processors with minimal communication requirements between processors.

Although the present invention has been shown and described with respect to several preferred embodiments thereof, various changes, omissions and additions to the form and detail thereof, may be made therein, without departing from the spirit and scope of the invention.

What is claimed is:

1. A subband channelizer, comprising:
a demultiplexer that demultiplexes a signal into a plurality of input samples and distributes said input samples to a plurality of channelizer filter banks in a round robin fashion, wherein each of the input samples is assigned to one of said plurality of channelizer filter banks;

a Fourier transformation module that receives outputs from said plurality of channelizer filter banks and performs Fourier transformation on each of the outputs of said channelizer filters, such that said Fourier transformation module outputs a plurality of Fourier signals; and a plurality of multiplier modules that receive said Fourier signals, such that each of said Fourier signals is assigned to one of said plurality of multiplier modules so that each of said Fourier signals is multiplied with an exponential value assigned to each of said plurality of multiplier modules to produce oversampled subbands.

2. The subband channelizer of claim 1, wherein said exponential value are defined as $$W_k = e^{(j2\pi k/K)+\phi}$$

where k=0, 1 ... K−1 and $\phi$ is a phase offset.

3. The subband channelizer of claim 2, wherein said phase offset is set at 0.

4. The subband channelizer of claim 2, wherein said phase offset is at /K.

5. The subband channelizer of claim 1, wherein said Fourier Transformation is a Fast Fourier Transformation.

6. The subband channelizer of claim 1, wherein Fourier transformation module is a Fast Fourier Transform processor.

7. A method of generating oversampled subbands, comprising:

providing a signal;

providing a demultiplexer that demultiplexes said signal into a plurality of input samples;

distributing said input samples to a plurality of channelizer filter banks in a round robin fashion, wherein each of the input samples is assigned to one of said plurality of channelizer filter banks;

receiving outputs from said plurality of channelizer filter banks;

performing Fourier transformation on each of the outputs of said channelizer filters;

outputting a plurality of Fourier signals; and multiplying each of said Fourier signals with assigned exponential values to produce oversampled subbands.

8. The method of claim 7, wherein said exponential values are defined as $$W_k = e^{(j2\pi k/K)+\phi}$$

where k=0, 1 ... K−1 and $\phi$ is a phase offset.

9. The method of claim 8, wherein said phase offset is set at 0.

10. The method of claim 8, wherein said phase offset is at /K.

11. The method of claim 7, wherein said Fourier Transformation is a Fast Fourier Transformation.

12. The method of claim 7, wherein said Fourier transformation is performed by a Fast Fourier Transform processor.

* * * * *